(12) United States Patent
Milicevic

(10) Patent No.: US 10,812,097 B1
(45) Date of Patent: Oct. 20, 2020

(54) MULTI-STAGE ANALOG TO DIGITAL CONVERTER

(71) Applicant: SEMICONDUCTOR COMPONENTS INDUSTRIES, LLC, Phoenix, AZ (US)

(72) Inventor: Sinisa Milicevic, Waterloo (CA)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/669,949

(22) Filed: Oct. 31, 2019

Related U.S. Application Data

(60) Provisional application No. 62/896,426, filed on Sep. 5, 2019.

(51) Int. Cl.
| | |
|---|---|
| *H03M 1/12* | (2006.01) |
| *H03M 1/36* | (2006.01) |
| *H03M 1/06* | (2006.01) |
| *H03M 1/14* | (2006.01) |

(52) U.S. Cl.
CPC .............. *H03M 1/36* (2013.01); *H03M 1/06* (2013.01); *H03M 1/124* (2013.01); *H03M 1/14* (2013.01)

(58) Field of Classification Search
CPC .......... H03M 1/36; H03M 1/124; H03M 1/06; H03M 1/14; H03M 1/12
USPC .................................................. 341/155, 118
See application file for complete search history.

(56) References Cited

U.S. PATENT DOCUMENTS

| | | | | |
|---|---|---|---|---|
| 6,784,814 B1* | 8/2004 | Nair | .................... | H03M 1/0641 |
| | | | | 341/118 |
| 9,077,359 B2* | 7/2015 | Thiagarajan | ........ | H03M 1/0845 |
| 9,077,360 B2* | 7/2015 | Dasgupta | ............ | H03M 1/0845 |
| 9,184,761 B2* | 11/2015 | Patki | .................... | H03M 1/0845 |
| 10,033,395 B1* | 7/2018 | Vaz | ........................ | H03M 1/125 |
| 10,103,742 B1* | 10/2018 | Guo | ...................... | H03M 1/145 |
| 2006/0114141 A1 | 6/2006 | Nandi et al. | | |
| 2010/0156692 A1 | 6/2010 | Jeon et al. | | |
| 2010/0182178 A1 | 7/2010 | Oo et al. | | |
| 2014/0247172 A1* | 9/2014 | Dasgupta | .............. | H03M 1/186 |
| | | | | 341/155 |
| 2014/0247173 A1* | 9/2014 | Patki | ................... | H03M 1/0854 |
| | | | | 341/155 |
| 2014/0247174 A1* | 9/2014 | Thiagarajan | .......... | H03M 1/125 |
| | | | | 341/155 |
| 2014/0247176 A1* | 9/2014 | S | ........................ | H03M 1/0836 |
| | | | | 341/155 |

\* cited by examiner

*Primary Examiner* — Jean B Jeanglaude
(74) *Attorney, Agent, or Firm* — Brake Hughes Bellermann LLP

(57) ABSTRACT

A multi-stage analog-to-digital converter (ADC) suitable for low power applications, such as glucose monitoring, may be required to digitize a slow-moving signal. As such, a multi-stage ADC must be versatile. Accordingly, the multi-stage ADC can be configured to operate at different bandwidths and resolutions through the use of ADC stages that can be enabled or disabled in an exchange between resolution and speed. Each ADC stage digitizes an input signal (e.g., a voltage or a current) using an analog comparison to access a lookup table for a digital signal that represents the input signal at a particular accuracy. Unlike other multi-stage approaches, the digitization is asynchronous (i.e., requires no clock) and can provide simplicity, speed, and low-power operation to the multi-stage ADC.

20 Claims, 9 Drawing Sheets

MULTI-STAGE ANALOG TO DIGITAL CONVERTER

CROSS-REFERENCE TO RELATED APPLICATIONS

This application claims the benefit of U.S. Provisional Patent Application No. 62/896,426, filed on Sep. 5, 2019, the entire contents of which is incorporated herein by reference.

FIELD OF THE DISCLOSURE

The present disclosure relates to microelectronics and more specifically to an analog-to-digital converter that can be adapted to different operating requirements.

BACKGROUND

Analog to digital conversion is necessary for many applications. An analog to digital converter (i.e., ADC) is a circuit configure for his conversion. The ADC is configured to produce a binary representation of an analog signal (i.e., voltage or current). An ADC is configured to divide a reference signal range and sample the various voltage (or current) levels at each division. The ADC is further configured to compare an input signal to each sampled level to produce a plurality of outputs that are at a high or a low (voltage) level depending on the comparison. The levels of the plurality of outputs may then be encoded to produce a digital representation of the input signal.

Requirements for an ADC may vary by application. Some applications may require an ADC to handle a high sampling rate (high bandwidth), while other applications may require a high number of bits (i.e. high resolution). It may be difficult for one ADC to simultaneously meet both requirements in their extremes because the complexity and power consumption of such a device would be impractical. For example, a high-resolution ADC may require too many comparison circuits to fabricate and to use at reasonable power levels. One approach for simplifying a high-resolution ADC is subranging. In subranging, multiple ADC's are cascaded, so that each ADC digitizes the input signal in an ever-increasing resolution. While reducing the required number comparison circuits, subranging (i.e., multi-stage) ADC's may still be complex and consume relatively high levels of power because they require one or more of the following: a sample-and-hold (S/H) circuit, (T/H) circuit, a digital to analog converter (DAC), a latch, an amplifier, a clock, and a processor configured for error correction. What is more, subranging ADC's cannot be reconfigured from low-bandwidth/high-resolution operation to high-bandwidth/low-resolution operation.

SUMMARY

In at least one aspect, the present disclosure generally describes a multi-stage analog-to-digital converter (ADC). The multi-stage ADC includes a plurality of ADC stages that are coupled in a sequence. Each ADC stage includes an asynchronous circuit and a lookup table configured to output a portion of a digital sample representing a level of an input signal in a reference range. Each ADC stage further includes a level computing circuit that is configured to generate an input signal for a subsequent ADC stage (i.e., a next input signal) and to generate a reference range for the subsequent ADC stage (i.e., a next reference range). The next input signal and the next reference range are generated according to the level of the input signal in the reference range. The level computing circuit is further configured to transmit the next input signal and the next reference range to the subsequent ADC stage in the sequence. The multi-stage ADC further includes a synchronizing and recording circuit that is configured to receive the portion of the digital sample from each of the plurality of ADC stages and to combine the portions by sequentially writing the portions to a location in a memory.

In another aspect, the present disclosure generally describes an ADC stage for a multi-stage ADC. The ADC stage includes a front-end computing circuit that is configured to receive an input signal and a reference range and to output signals at a plurality of front-end outputs. Each output signal at the plurality of front-end outputs corresponds to a comparison between the input signal and a level in the reference range. The ADC stage further includes an encoding circuit that receives the plurality of outputs and, based on the plurality of outputs, retrieves a digital word from a lookup table, and outputs the digital word at an ADC-stage output. The ADC stage further includes a quantum-level (i.e., level) computing circuit coupled to the input signal and to the plurality of front-end outputs. The quantum-level computing circuit is configured to determine a relative level of the input signal within the reference range and to modify, based on the relative level, the reference range and the input signal for a subsequent ADC stage in the multi-stage ADC.

In another aspect, the present disclosure generally describes a method for digitizing an analog signal. The method includes receiving an input signal and a reference range at an ADC stage in a sequence of ADC stages. The method also includes comparing the input signal to a plurality of levels in the reference range. The method also includes identifying an entry in a lookup table based on the comparison of the input signal to the plurality of levels. The method also includes generating a portion of a digital sample representing the input signal based on the entry. The method also includes determining a level of the input signal within the reference range. The method also includes modifying the input signal and the reference range. The method further includes repeating the operations described above (i.e., the receiving, the comparing, the identifying, the generating, the determining, and the modifying at a subsequent ADC stage in the sequence of ADC stage (i.e., the subsequent stage receives the modified input signal and the modified reference range).

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

Figure 1:
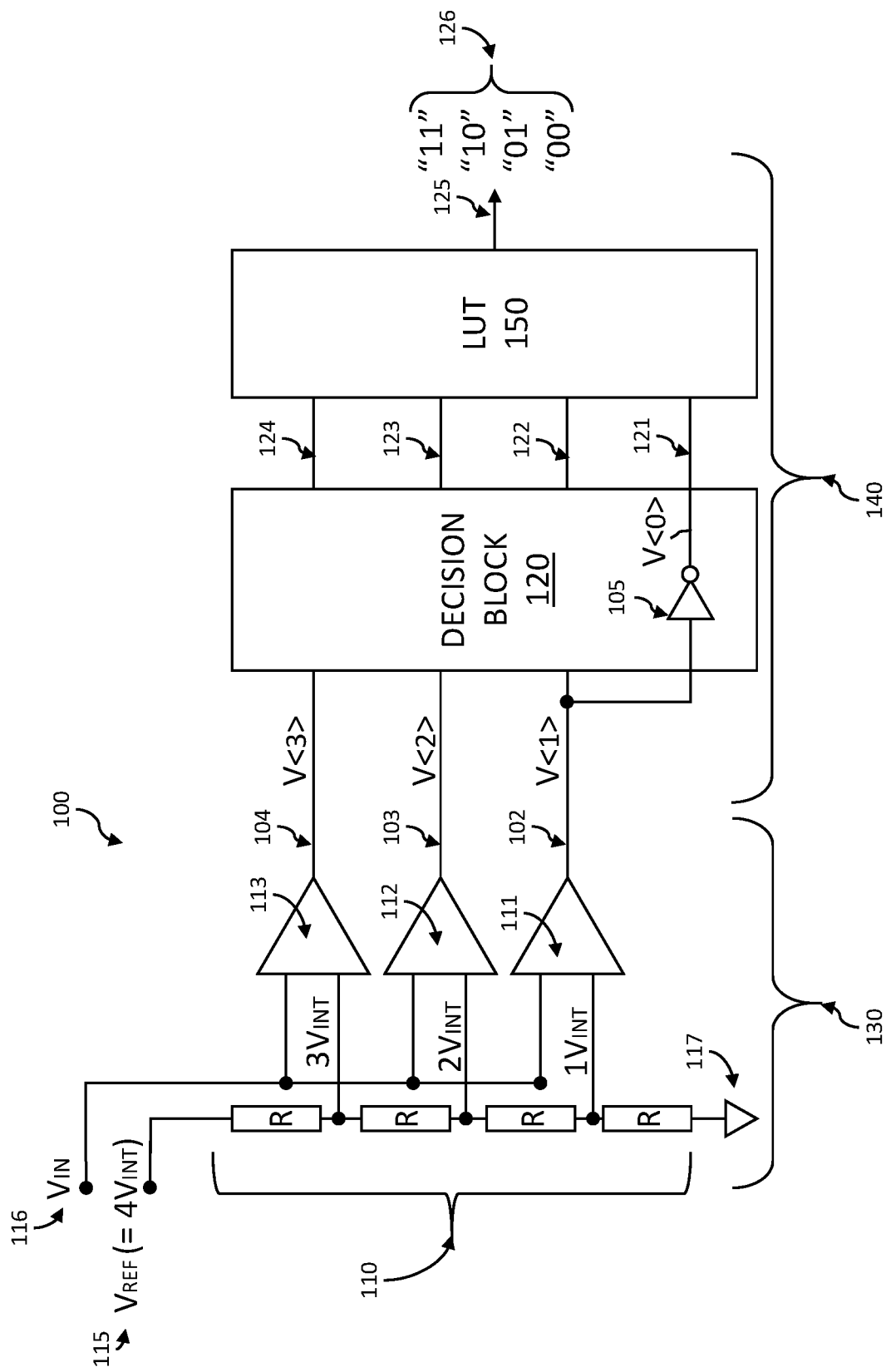
FIG. 1 schematically depicts a possible voltage-mode ADC stage configured to digitize a voltage signal.

The present disclosure describes a highly configurable multi-stage analog-to-digital converter (ADC) for digitizing a voltage or a current. The disclosed multi-stage ADC consumes very little power in applications that require digitizing a slow-moving signal. The disclosed multi-stage ADC can also provide an adaptable bandwidth and a selectable resolution for applications with other requirements. The disclosed multi-stage ADC can achieve these features through the use of multiple stages, lookup tables, and local memory storage. Unlike other multi-stage approaches, the disclosed multi-stage ADC can digitize asynchronously (i.e., without a clock) and does not require the complexity or power consumption associated with circuit elements, such as a sample-and-hold (S/H) circuit, a (T/H) circuit, a digital to analog converter (DAC), a latch, a clock, or a processor (e.g., configured for error correction). In other words, asynchronous, analog circuits can be used for digitization.

The disclosed multi-stage ADC is well suited for low power, low bandwidth signals. For example, the multi-stage ADC may be used in medical devices and/or sensors that monitor a slowly (e.g., ≤1 hertz (Hz)) moving condition (e.g., blood sugar). The multi-stage ADC may draw very little current (e.g., 10 nA) when operating, thereby increasing the life of a battery for the medical device. Additionally, monitoring a slow-moving signal (e.g., a signal having a bandwidth of 1 Hz or less) typically requires an integration time that is long (e.g. seconds to minutes). The disclosed multi-stage ADC can be configured to monitor the slowly moving condition with a shorter integration time. This reduction in integration time can allow a monitoring system to reduce a duty cycle requirement for measurement allowing the system to save power by utilizing a sleep-wake-sample-sleep process that is very efficient. In other words, all (or a portion) of the ADC stages in the multi-stage ADC may be periodically enabled to obtain a digital sample and otherwise disabled to reduce power consumption. These features make the disclosed multi-stage ADC suitable for use in variety of systems including (but not limited to) a glucose monitoring system, an impedance measurement system, a computed tomography system, a scanning data acquisition system, a photodiode sensor system, an X-ray detection system, and a voice-band audio system.

The disclosed multi-stage ADC may include multiple (e.g., three) ADC stages. The disclosed multi-stage ADC is adaptable and ADC stages can be configured or reconfigured based on a required resolution or speed. The disclosed multi-stage ADC has a resolution (i.e., bit depth) that can be increased by increasing the number of ADC stages used. The disclosed multi-stage ADC has a conversion speed (i.e., digitizing speed, speed) that can be decreases as the number of stages is decreased. That is, at least one of the subsequent ADC stages in the sequence of multiple ADC stages can be omitted (e.g., disabled) to obtain a faster digitization (i.e., at a lower resolution) In a possible implementation, the disclosed multi-stage ADC may be configured to digitize an input current at a picoampere (pA) resolution (e.g., 12-bit resolution applied to 2 mirco-ampere (µA) input signal). This sensing resolution may be suitable for some medical applications (e.g., glucose monitoring).

FIG. 1 schematically depicts a possible ADC stage of the disclosed multi-stage ADC. The ADC stage can be configured to digitize an input voltage ($V_{IN}$) according to a possible implementation of the present disclosure. For the sake of simplicity and understanding, the ADC stage shown maps the input voltage to one of four levels (i.e., quantum levels) and then encodes these four levels as a 2-bit digital word. This implementation is presented for simplicity and to help understanding. The implementation shown is not intended to be limiting for at least the reason that the mapping and encoding of the disclosed ADC stage may be implemented in conceptually similar but practically different ways. For example, the mapping and encoded may be implemented more generally using any number of levels and bits for digitizing the input voltage.

The ADC stage 100 may be generally divided by function into a front-end computing portion 130 (i.e., front-end portion, front-end computing circuit, front-end) and an encoding portion 140 (i.e., encoder). The front-end portion 130 can be configured to receive a reference voltage 115 (i.e., $V_{REF}$) and an input voltage 116 (i.e., $V_{IN}$). Based on these inputs, the front-end portion 130 can be configured to generate signals (e.g., high or low voltage levels) at a plurality of outputs 102, 103, 104. Each output 102, 103, 104 has a signal level (i.e., V<1>, V<2>, V<3>) corresponding to a comparison between the input voltage and a voltage (i.e., a voltage level) in a reference voltage range. The reference voltage range is defined as the range between the reference voltage 115 and a ground voltage 117.

The comparisons of the front-end are performed by a plurality of comparators 111, 112, 113 (i.e., decision units), which can each be implemented as an operational amplifier configured to compare two inputs. Each comparator in the plurality has a first input that is coupled to (i.e., receives) the input voltage 116 (i.e., $V_{IN}$) and a second input that is coupled to (i.e., receives) a voltage in the reference voltage range. The particular voltage in the reference voltage range that each comparator receives can be determined by a voltage divider 110 that includes a plurality of resistors (R) (e.g., equal value resistors) coupled in series between the reference voltage 115 and the ground voltage 117. The resistors in the voltage divider can divide the reference voltage range into voltage intervals ($V_{INT}$) (i.e., voltage levels, quantum levels, voltage increments, etc.). Nodes between resistors in the voltage divider may be coupled to (i.e., tapped) in order to obtain a tapped voltage that is a multiple of the voltage increment (e.g., $1V_{INT}$, $2V_{INT}$, $3V_{INT}$). Each comparator 111, 112, 113 can be configured to receive a voltage tapped from a different node of the voltage divider 110. In a possible implementation, each comparator can output a high voltage (i.e., HIGH) when the input voltage ($V_{IN}$) at the first input is greater than the tapped voltage at the second input and can output a low voltage (i.e., LOW) when the input voltage ($V_{IN}$) is less than the voltage than the tapped voltage at the second input. Because each comparator receives an incrementally different tapped voltage, the outputs of the comparators map the input voltage 116 to the reference voltage range. For example, all outputs (V<1>, V<2>, V<3>) are HIGH for an input voltage approximately equal to the reference voltage 115 and all outputs (V<1>, V<2>, V<3>) are LOW for an input voltage 116 that is approximately equal to the ground voltage 117. For an input voltage between the ground voltage 117 and the reference voltage 115 some outputs (V<1>, V<2>, V<3>) may be HIGH and some outputs may be LOW. The outputs may respond to the level of the input voltage ($V_{IN}$) like the level of mercury in a thermometer responds to a temperature. For example, the table below illustrates a possible relationship between the input voltage ($V_{IN}$) and the outputs (V<1>, V<2>, V<3>).

TABLE 1

$V_{IN}$ versus front-end outputs for the possible implementation of FIG. 1

| VIN | V <1> | V <2> | V <3> |
|---|---|---|---|
| $V_{IN} < V_{INT}$ | LOW | LOW | LOW |
| $V_{INT} < V_{IN} < 2V_{INT}$ | HIGH | LOW | LOW |
| $2V_{INT} < V_{IN} < 3V_{INT}$ | HIGH | HIGH | LOW |
| $3V_{INT} < V_{IN} < 4V_{INT}$ | HIGH | HIGH | HIGH |

The outputs of the comparators for the front-end computing portion 130 of the ADC stage 100 are received by the encoding portion 140 of the ADC stage. The encoding portion 140 is configured to convert analog signals at a plurality of inputs (i.e., V<1>, V<2>, V<3>) into a digital signal 126 at its output 125.

In a possible implementation, the encoding portion 140 includes a decision block. The decision block 120 may include circuitry (e.g., logic circuitry) to convert a signal pattern formed at the plurality of decision block inputs 102, 103, 104 into an output at one or more decision block outputs 121, 122, 123, 124. For example, a HIGH/LOW combination of V<1>, V<2>, and V<3> may produce a HIGH at one of the plurality of decision block outputs 121, 122, 123, 124. In a possible implementation, the decision block 120 includes an inverter 105 that is coupled to a first output 102 of the front-end computing portion. The inverter 105 can be configured to output a HIGH signal (i.e., a voltage above a logic threshold) to a first output of the decision block 121 when V<1> is a LOW signal. In this implementation, the first output (V<0>) can be a HIGH signal when $V_{IN} < V_{INT}$ (see TABLE 1). Similarly, the decision block may include other logic circuitry (not shown) to produce a HIGH output a one of the other decision block outputs 122, 123, 124 based on the HIGH/LOW pattern formed at the front-end outputs 102, 103, 104.

In a possible implementation, the encoding portion 140 further includes a lookup table (LUT) 150. The LUT may be configured to store all possible digital outputs (i.e., samples) for the ADC stage 100. The LUT may be implemented as a read-only memory (ROM) storing digital words at different lines or addresses. The LUT can be accessed by the decision block to output a particular line or address in the memory. A HIGH signal at a decision block output (i.e., and LOW signals at all other decision block outputs) may access the LUT.

In the implementation shown in FIG. 1 the front-end computing portion 130 divides the reference voltage ($V_{REF}$) into four levels (i.e., increments, intervals). These four voltage levels may be represented by a digital word of 2-bits (i.e., $N=2^M$, where N=levels and M=bits). Accordingly, the LUT table 150 shown in FIG. 1 includes four possible 2-bit digital words 126 (i.e., 00, 01, 10, 11). The outputs of the decision block 121, 122, 123, 124 can configure the LUT to couple a particular digital word to an output 125 of the ADC stage.

The ADC stage described does not require, in at least some implementations, a clock for operation (i.e. is asynchronous) and may not require combinatorial and/or sequential logic to generate a digital representation of an input signal (i.e., the digital word). Instead, the ADC can use an analog font-end to access a lookup table (LUT) entry corresponding to the input signal and to cause the LUT to output the entry as a digital signal. Because the LUT can store idealized (e.g., perfect) digital representations, the digital signal at the output of the ADC may have fewer artifacts (e.g., glitches) than those generated by an ADC stage using combinatorial and/or sequential logic. Other advantages of the disclosed ADC stage may include an increased conversion speed (e.g., due at least in part to the analog front-end) and a reduction in a power consumption of the ADC stage (e.g., because no clock is required). Additionally, the lack of synchronization may make it easier to sleep and wake the ADC stage as part of a sampling processes.

The ADC stage of FIG. 1 is a voltage-mode ADC stage that is configured to digitize an analog voltage, and the multi-stage ADC may include at least one ADC stage implemented as a voltage-mode ADC stage. In another possible implementation, however, the multi-stage ADC may include at least one ADC stage implemented as a current-mode ADC stage. The current-mode ADC stage is configured to digitize an analog current.

Compared to a voltage-mode ADC stage, a current-mode ADC stage can offer advantages. Some advantages in some implementations are immunity to ground/power-supply noise, immunity to signal line impedance, no required high voltage-gain amplifiers, no required high-precision resistors/capacitors, an inherent low-voltage swing, high-speed operation, and/or can be easily realized in a standard digital process. In other words, the current-mode ADC can operate at higher frequencies than the voltage-mode ADC as power supply voltages are decreased. Moreover, in some applications, such as glucose monitoring or photo detection, the current-mode ADC can interface directly with current signals from sensors (i.e., without conversion to voltage).

While the multi-stage ADC may include all voltage-mode ADC stages, all current-mode ADC stages, or any combination thereof, the remainder of the disclosure will discuss the current mode ADC stage and a multi-stage ADC implementation that includes all current-mode ADCs at least because of the advantaged listed above.

Figure 2:
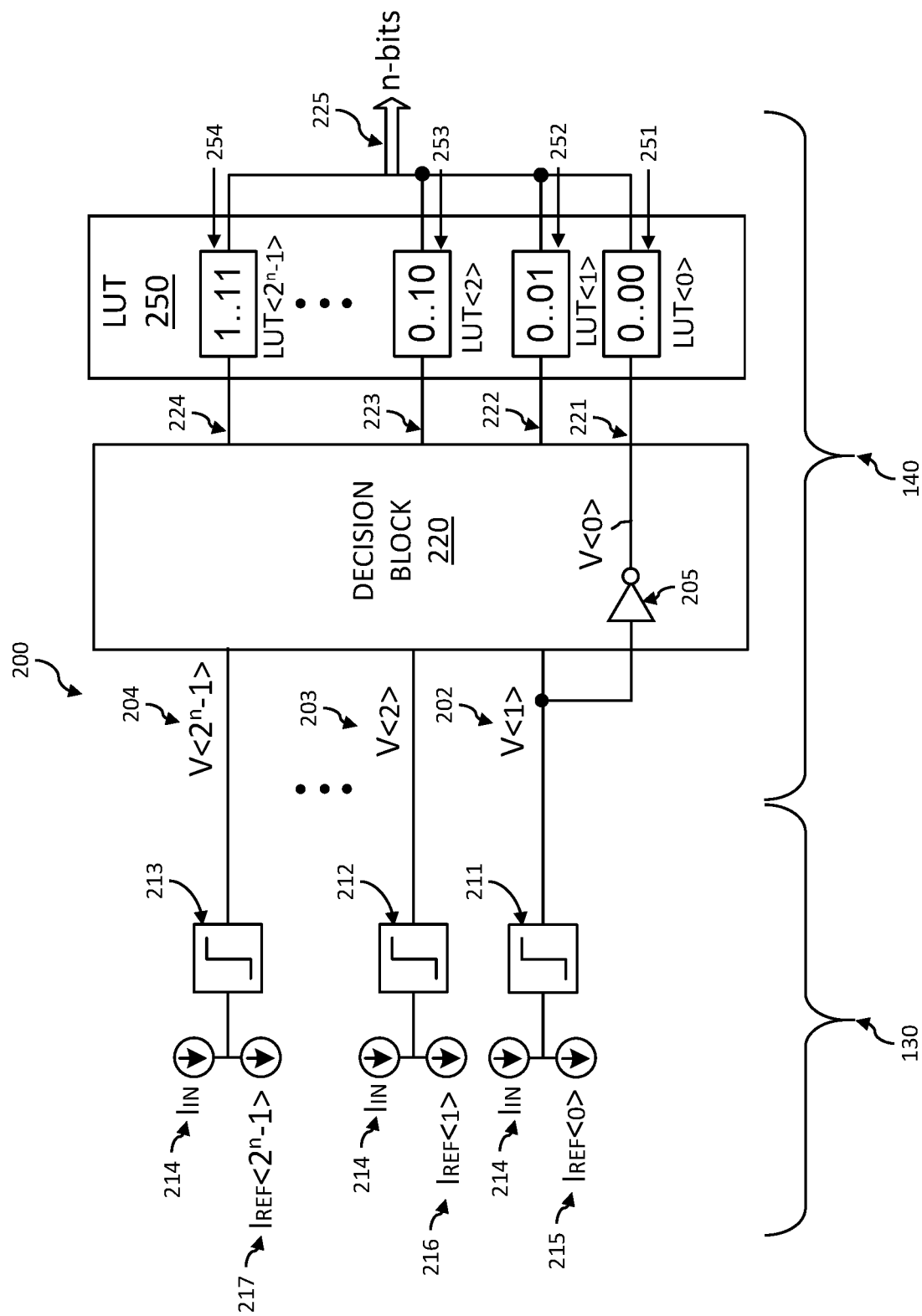
FIG. 2 schematically depicts a possible current-mode ADC stage configured to digitize a current signal.

FIG. 2 schematically depicts a possible implementation of a current-mode ADC stage that can be used with the disclosed multi-stage ADC. As with the voltage-mode ADC stage, the current-mode ADC stage 200 may be generally divided by function into a front-end computing portion 130 (i.e., front-end) and an encoding portion 140 (i.e., encoder). The front-end portion 130 maps an input current ($I_{IN}$) into a range $2^n$ possible levels (i.e. quantum levels) and the encoding portion 140 converts the mapped level into an n-bit digital representation at an output 225 of the current-mode ADC stage. The output 225 may be configured to convey the n-bit digital word over a single transmission line or over multiple lines (e.g., a bus).

The front-end computing 130 of the current-mode ADC stage 200 can include a plurality of decision units (e.g., comparators) 211, 212, 213 that are configured to compare an input current 214 to a current level 215, 216, 217 (i.e.

from a current source) in a reference current range. For example, a first comparator 211 (e.g., implemented as an inverter) may be configured to receive a difference between the input current 214 (i.e., $I_{IN}$) and a first reference current level 215 (i.e., $I_{REF}$<0>). The first comparator 211 may output a first voltage 202 (i.e., V<1>) having a level (e.g., HIGH or LOW) based on the comparison. Likewise, a second comparator 212 may be configured to output a HIGH or a LOW second voltage 203 (i.e., V<2>) based a difference between the input current ($I_{IN}$) and a second reference current level 216 ($I_{REF}$<1>). The second reference current may be larger than the first reference current by a current increment. When the reference current range is divided equally into n increments the front end includes $2^n-1$ comparators that each receive an incrementally larger current. Accordingly, the voltage levels of the outputs 202, 203, 204 of the comparators 211, 212, 213 creates a sequence of HIGH and LOW voltages at a plurality of (e.g., $2^n-1$) front-end outputs 202, 203, 204.

The encoding portion 140 of the current-mode ADC stage can include a decision block 220. The decision block 220 can be configured to receive a plurality (e.g., $2^n$) decision-block inputs 202, 203, 204. The decision-block inputs have signals (i.e., HIGH or LOW) representing a level of the input current ($I_{IN}$) relative to a reference current range ($I_{REF}$). For example, when an input current is above a quantum level (e.g., above $I_{REF}$<0>, $I_{REF}$<1>, or $I_{REF}$<$2^n-1$>) then all decision-block inputs corresponding to the quantum level and below will be HIGH while all decision-block inputs above the quantum level will be LOW. Based on the pattern of HIGH and LOW signals at the plurality of decision-block inputs, the decision block 200 is configured to generate a particular HIGH/LOW pattern on a plurality (e.g., $2^n$) of decision-block outputs. For example, the decision block may output a HIGH voltage signal on one of the plurality of outputs while outputting a LOW voltage signal on all other outputs. In a possible implementation, the decision block 220 includes an inverter 205 that is coupled to a first decision block input 202. The inverter 205 can be configured to output a HIGH signal (i.e., a voltage above a logic threshold) to a first output of the decision block 221 when V<1> is a LOW signal. In this implementation, the first output (V<0>) can be a HIGH signal when the current is below $I_{REF}$<0>. Similarly, the decision block may include other logic circuitry (not shown) to produce a HIGH output a one of the other decision block outputs 222, 223, 224 based on the HIGH/LOW pattern formed at the front-end outputs 202, 103, 204.

The encoding portion 140 of the current-mode ADC may further include a lookup table 250 (LUT) that is configured to output a stored digital word based on signal levels at a plurality (e.g., $2^n$) of LUT inputs 221, 222, 223, 224. The LUT may be implemented as a memory (e.g., ROM memory) that stores a plurality of (e.g., $2^n$) binary words 251, 252, 253, 254. the signals at the LUT inputs can address the memory to retrieve a particular stored digital representation (e.g., a n-bit binary word) of the input current. For example, a HIGH signal at one of the plurality of LUT inputs 221, 222, 223, 224 and LOW signals at all other LUT inputs may cause the LUT to output a particular n-bit binary word (i.e., signal) at an LUT output, which in a possible implementation is the output 225 of the current-mode ADC stage. Accordingly, the output 225 of the current-mode ADC is a (e.g., n-bit) digital word that corresponds to a level of the input current ($I_{IN}$) relative to a reference current ($I_{REF}$).

The conversion of the current-mode ADC stage may be asynchronous based on (at least) the analog architecture of the front-end computing portion 130 and the decision block 220. The digital signal at the output of the current-mode ADC stage may be based on a stored entry and therefore may be free of noise and artifacts.

Figure 3:
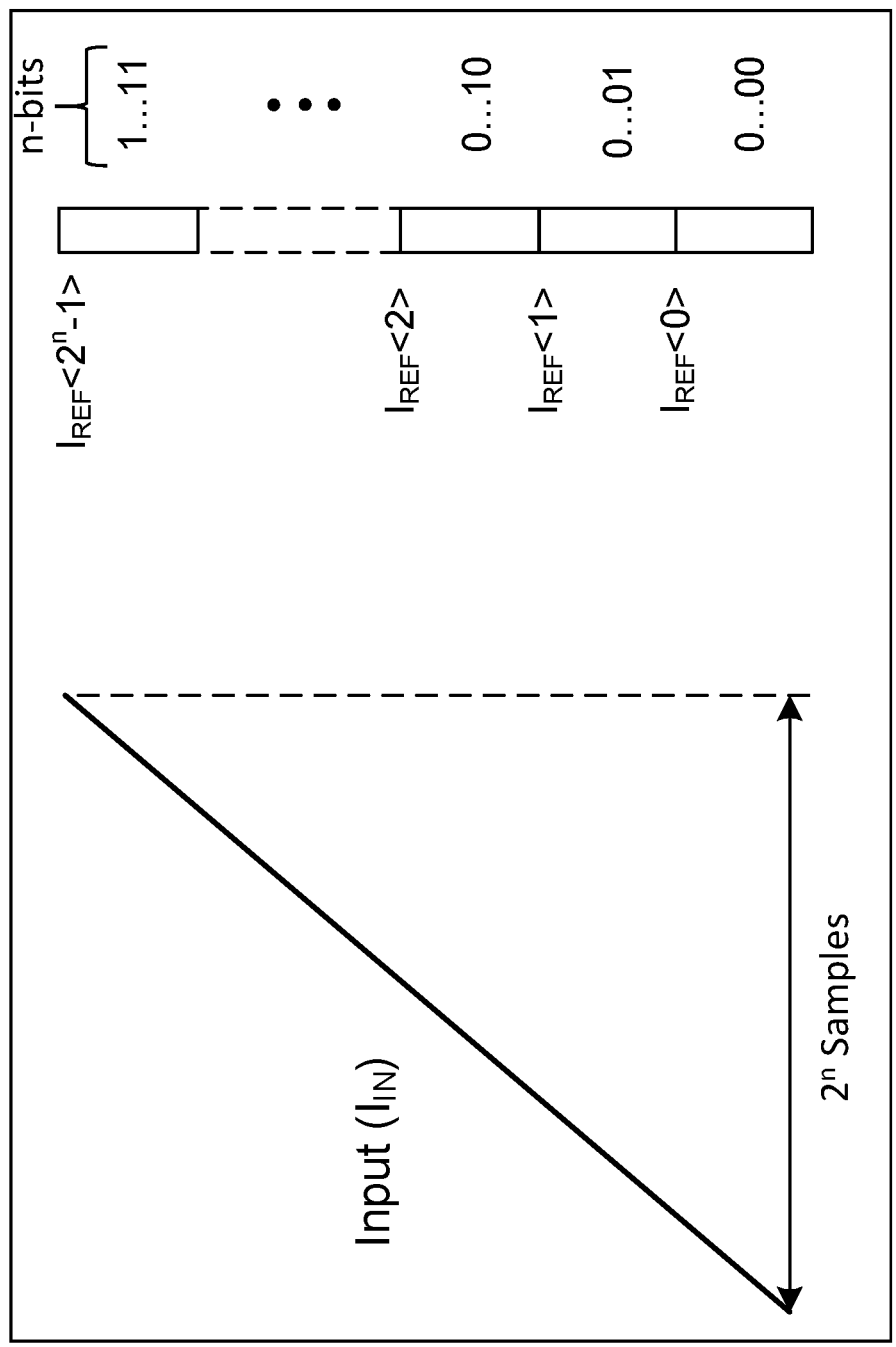
FIG. 3 graphically depicts representations of input and output signals for an ADC stage according to an implementation of the present disclosure.

FIG. 3 graphically depicts representations of input and output signals for a single (current mode) ADC stage. As shown, the input signal $I_{IN}$ can be represented by any of $2^n$ possible samples, where a sample is an n-bit digital word. For many applications, it is desirable to have a large (e.g., >64=$2^n$) number of levels to represent an input signal (i.e., to have a high resolution) in a conversion process. Because an ADC stage can include $2^n-1$ decision units for a conversion, high-resolution conversions using a single ADC stage may be impractical.

Figure 4:
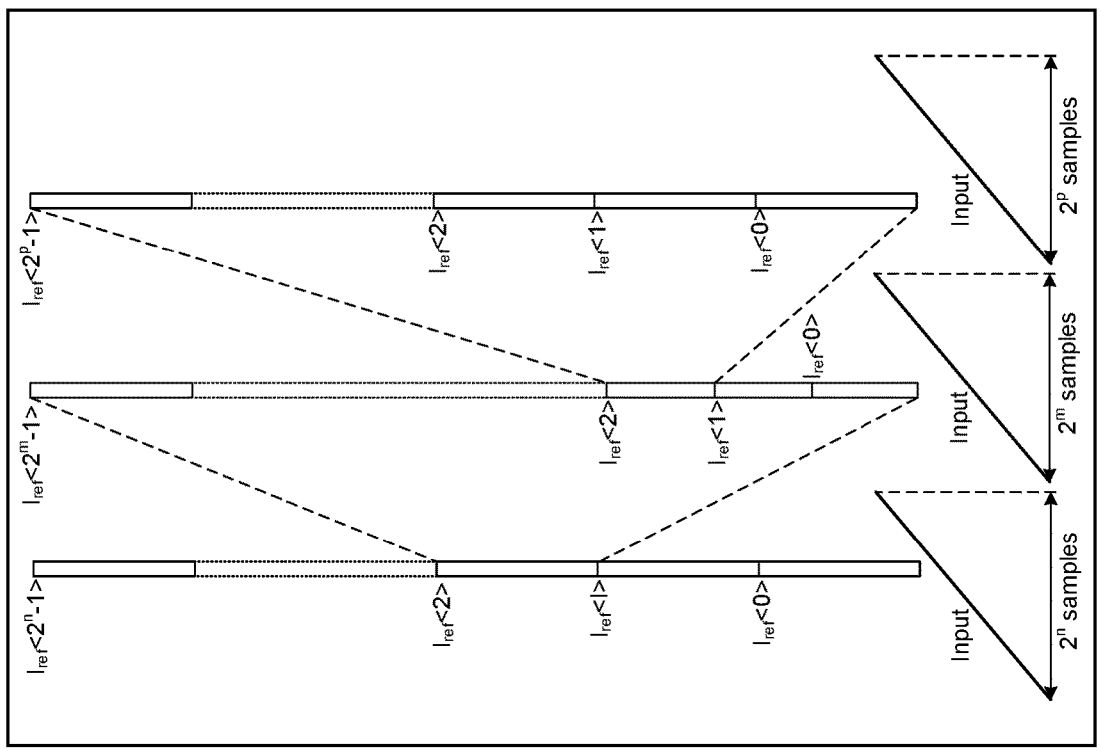
FIG. 4 graphically depicts representations of input and output signals for a multi-stage ADC.

FIG. 4 graphically depicts representations of input and output signals for a multi-stage ADC. Conversion is shown using three stages. A first ADC stage may output one of $2^n$ possible n-bit digital words (i.e. samples) to represent a first level of an input current relative to a first reference current range (i.e. relative to a first reference current). A second ADC stage may output one of $2^m$ possible m-bit digital words to represent a second level of an input current relative to a second reference current range. The second reference current range can be configured based on the results of the first conversion. A third ADC stage may output one of $2^p$ possible p-bit digital words to represent a third level of an input current relative to a third reference current range. The third reference current range can be configured based on the results of the second conversion. The disclosed multi-stage ADC is not limited to three ADC stages, as shown in FIG. 4, and possible implementations may use more or fewer ADC stages.

As shown, the reference current range of the second ADC stage may be adjusted to span adjacent levels from the first ADC stage, where the adjacent levels are determined by first current level. Likewise, the reference current range of the third ADC stage may be adjusted to span adjacent levels from the second ADC stage, where the adjacent levels are determined by the second current level. The bit resolution of the three ADC stages (n, m, p) may be the same or different (i.e., the number of levels of the three ADC stages may be the same or different).

Each ADC stage can be configured to provide reference current for a subsequent stage. For example, the reference current range of the first ADC stage can be fixed, but the reference current range of a subsequent ADC stage can be based conversion results of a previous ADC stage. Because the conversion maps a relative level of an input current to a reference current range (i.e., the level of the input signal within the reference range), the reference current level (i.e., the next reference level), the input current level (i.e., the quantum level), or both may be adjusted and provided as an input to each subsequent ADC stage.

Each successive ADC stage in the multi-stage ADC is configured to output a sample that characterizes the input current at a higher level of detail (i.e., accuracy). The first ADC stage can provide a coarse digital representation of the input current and each successive ADC stage can provide a finer digital representation of the input current. For example, the first ADC stage may output n-bits that represent the n most significant bits of a digital representation of the input current; the second ADC stage may output m-bits that represent the next m significant bits of a digital representation of the input current; and the third ADC stage may output p-bits that represent the next p significant bits of a digital representation of the input current (i.e., the p most least significant bits).

A digital representation of the input current may be created by appending the n-bits of the first stage, the m-bits of the second stage, and the p-bits of the third stage a digital word, from a most significant bit (MSB) to a least significant bit (LSB). The appending creates a digital word of n+m+p bits that represent the input current.

One advantage of the multi-stage approach is that the resulting analog to digital conversion may have a high resolution despite using ADC stages having lower resolutions. For example, if the multi-stage ADC has three ADC stages and if each of the ADC stages is 4-bits then the combined resolution of the multi-stage ADC is 12 bits. Another advantage of the multi-stage approach is that the level of precision required to represent the input current may be determined by the number of ADC stages used. For example, if precision is not necessary, then only the first ADC stage may be used to provide a digital representation of the input current that is the n-most significant bits only, and by only using the first stage, a conversion speed (i.e. speed, bandwidth) may be increased (i.e., at the expense of resolution).

Each of the ADC stages in the disclosed multi-stage ADC may operate asynchronously to output a digital signal representing an analog input signal (i.e., may perform an asynchronous conversion). After conversion, the disclosed multi-stage ADC may operate synchronously to append the results from each ADC stage and (in a possible implementation) to record the resulting appended digital sample. Accordingly, the multi-stage ADC may include an asynchronous portion and a synchronous portion.

Figure 5:
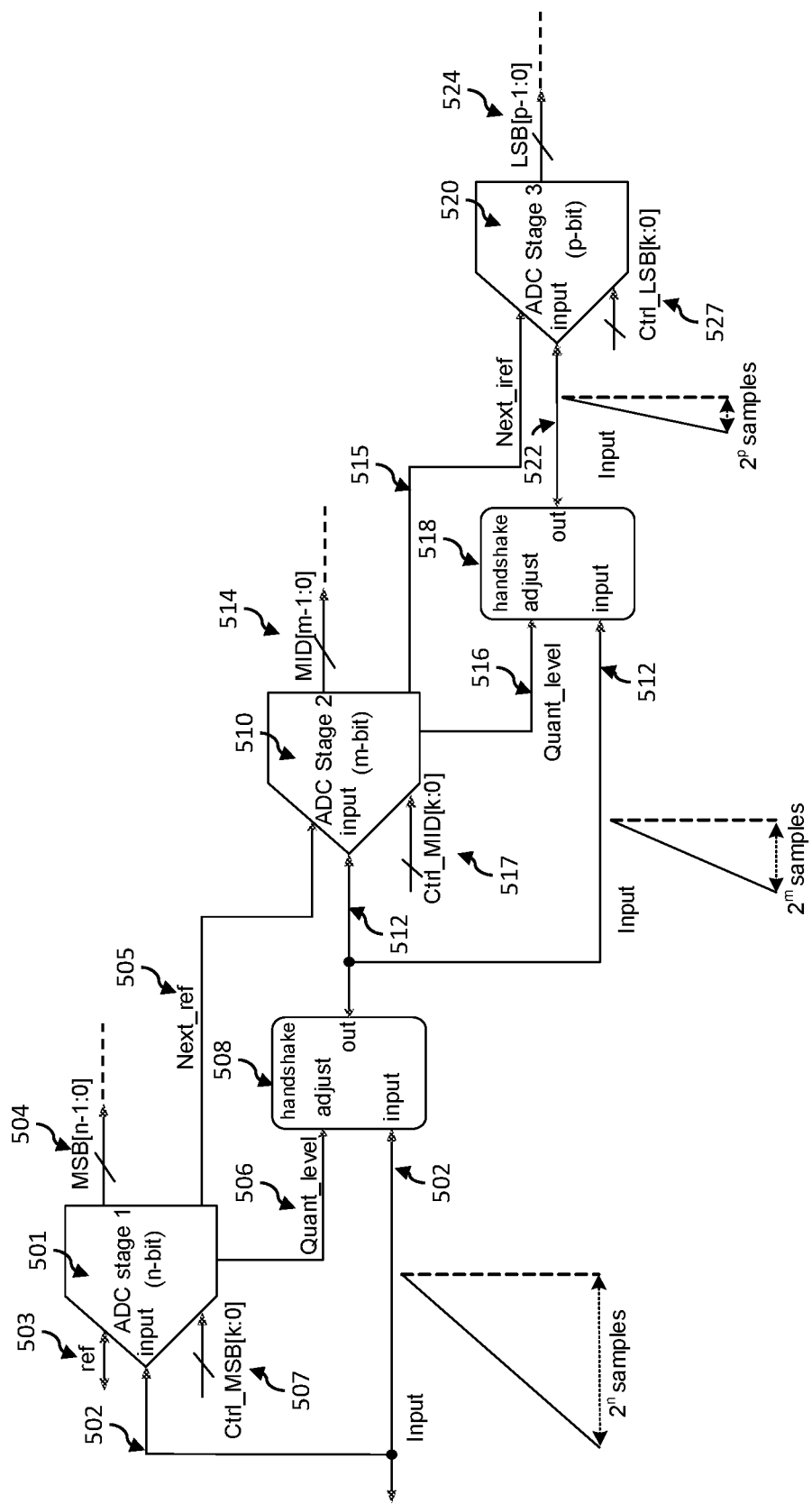
FIG. 5 schematically depicts an asynchronous, analog portion of a multi-stage ADC according to an implementation of the present disclosure.

FIG. 5 schematically depicts an asynchronous portion of a multi-stage ADC. The implementation shown, include three ADC stages, and each ADC stage may be implemented as a voltage-mode ADC stage (e.g., see FIG. 1) or a current-mode ADC stage (e.g., see FIG. 2). The stages are connected in sequence and the first ADC stage is a n-bit resolution ADC stage, the second ADC stage is a m-bit resolution ADC stage, and the third ADC stage is a p-bit resolution ADC stage.

The multi-stage ADC includes a first ADC stage 501 that is configured to receive a first input signal 502 (e.g., first input current) and a first reference signal 503 (e.g., first reference current). The first ADC stage also receives a first control signal 507. The first control signal may configure the first ADC stage for a particular function, may enable one or more features of the first ADC stage, and/or may enable/disable the first ADC stage. Based on the first input signal 502 and the first reference signal 503, the first ADC stage is configured to output a first digital output 504 as described previously.

The first ADC stage 501 is coupled to the second ADC stage 510. The first ADC stage 501 is further configured to provide (i.e., transmit) a second reference signal 505 (Next_ref) to the second ADC stage 510 (i.e., to serve as a reference signal for the second ADC stage). The first ADC stage 501 is further configured to provide a first quantum-level signal 506 (Quant_level) that corresponds to a quantum level (i.e., level) associated with (i.e., describing the level of) the first input signal 502. The first quantum level signal 506 and the first input signal 502 are input to a first handshake circuit 508 that is configured to produce a second input signal 512 for the second ADC stage 510.

The multi-stage ADC further includes a second ADC stage 510 that is configured to receive the second input signal 512 (e.g., second input current) and the second reference signal 505 (e.g., second reference current). The second ADC stage also receives a second control signal 517. The second control signal may configure the second ADC stage for a particular function, may enable one or more features of the second ADC stage, and/or may enable/disable the second ADC stage. Based on the second input signal 512 and the second reference signal 505, the second ADC stage is configured to output a second digital output 514 as described previously.

The second ADC stage 510 is coupled to the third ADC stage 520. The second ADC stage 510 is further configured to provide a third reference signal 515 (Next_iref) to the third ADC stage 520 (i.e., to serve as a reference signal for the second ADC stage). The second ADC stage 510 is further configured to provide a second quantum-level signal 516 (Quant_level) that corresponds to a quantum level (i.e., level) associated with (i.e., describing the level of) the second input signal 512. The second quantum level signal 516 and the second input signal 512 are input to a second handshake circuit 518 that is configured to produce a third input current 522 for the third ADC stage 510.

The multi-stage ADC further includes a third ADC stage 520 that is configured to receive the third input signal 522 (e.g., third input current) and the third reference signal 515 (e.g., third reference current). The third ADC stage also receives a third control signal 527. The third control signal may configure the third ADC stage for a particular function, may enable one or more features of the second ADC stage, and/or may enable/disable the second ADC stage. Based on the third input signal 522 and the third reference signal 515, the third ADC stage is configured to output a third digital output 520 as described previously.

Figure 6:
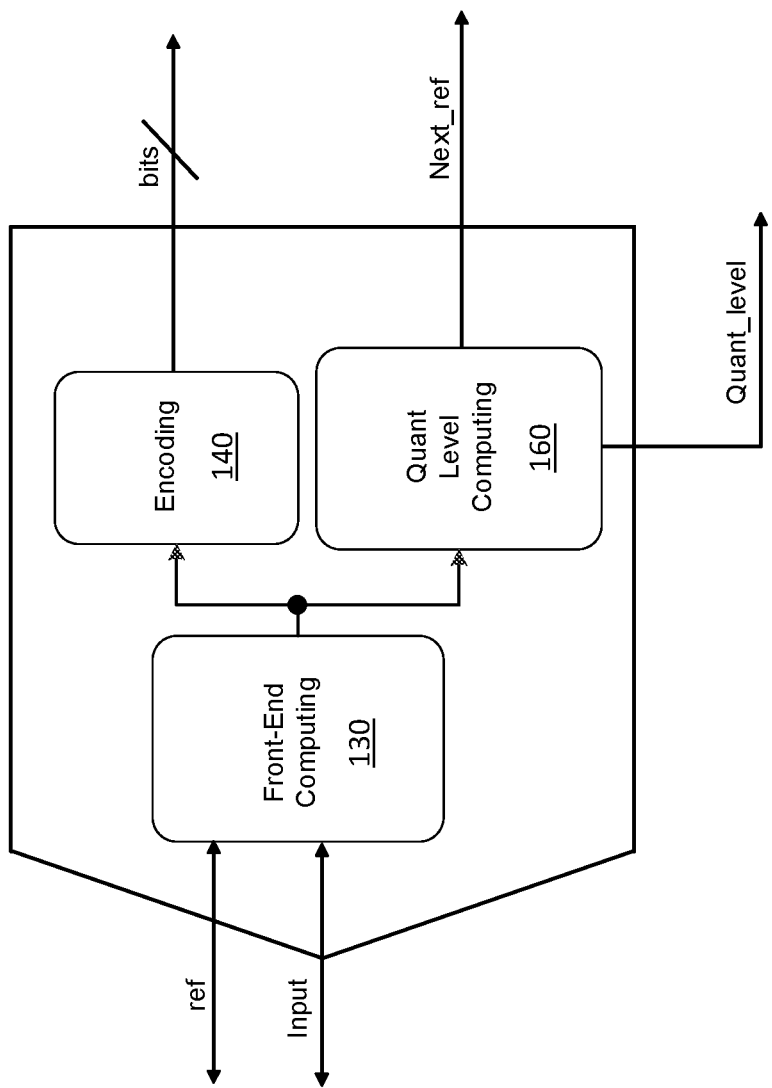
FIG. 6 is a block diagram of an ADC stage suitable for use in a possible implementation of a multi-stage ADC.

The first ADC stage 510, the second ADC stage, and/or the third ADC stage may be implemented as shown in FIG. 6. The ADC stage shown includes a front-end computing portion 130 (i.e., front-end circuit) and an encoding portion 140 (i.e., encoding circuit), as described previously. The ADC stage further includes a quantum level computing portion 160 (i.e., quantum level computing circuit). The quantum level computing portion receives the font-end's plurality of outputs and based on these output signal creates a quantum-level signal (Quant_level) corresponding to the level of the input current and a reference signal (Next_ref) for the next ADC stage in the sequence.

Figure 7:
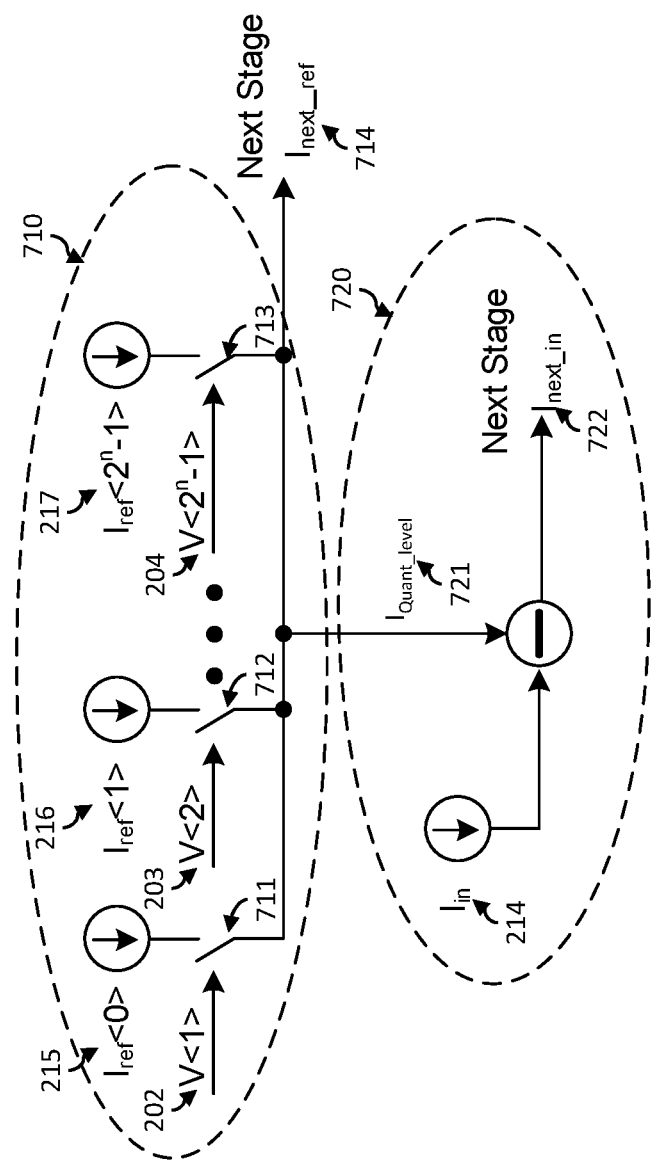
FIG. 7 schematically depicts a quantization-level computing circuit and a handshake circuit for an ADC stage suitable for use in a possible implementation of a multi-stage ADC.

FIG. 7 schematically illustrates circuits that can be used in the multi-stage ADC for quantum level computing and for handshaking between ADC stages. The circuits shown are suitable for a current-mode ADC stage, such as shown in FIG. 2. A current mode ADC may include a quantum level computing portion 710 (i.e., quantum level computing circuit) that includes a plurality of switches 711, 712, 713. Each of the plurality of switches can be configured to pass or block one of the incremental currents 215, 216, 217 in the reference current range. The plurality of switches are controlled by the signals (V<1>, V<2>, V<$2^n$–1>) from the outputs 202, 203, 204 of the front end portion 130 of the ADC stage. For example, if decisions units of the front-end portion 130 determine that an input current ($I_{IN}$) is between a first reference current level $I_{REF}$<0> and a second reference current level $I_{REF}$<1>, then a first front end output signal (i.e., V<1>) can be a HIGH signal and all other front end output signals (i.e., V<2> through V<$2^n$–1>) can be a LOW signal. In this condition, a first switch 711 of the quantum-level computing circuit is closed while the other remain open. Accordingly, $I_{REF}$ 714 for the next stage is configured to be $I_{REF}$<0>. A handshake circuit 720 is configured to generate an input current 722 for the next stage by subtracting a current 721 computed by the quantum level computing circuit ($I_{QUANT\_LEVEL}$) from the input current for the present stage 214.

The outputs 504, 514, 524 of the multi-stage ADC represent portions of a sample of the input signal (i.e., MSB [n−1:0]). As shown, the first ADC stage 501 is configured to output a digital signal that represents the first-n most significant bits of the sample. The second ADC stage 510 is configured to output a digital signal that represents the next-m most significant bits of the sample (i.e., MID[m−1: 0]). The third ADC stage 520 is configured to output a digital signal that represents the p-most least significant bits of the sample (i.e., LSB[p−1:0]). When precision (i.e., resolution) of the sample is desired, then all three ADC stages may be used to represent the input signal 502. The sample may be created by appending the outputs of each stage (i.e., MSB [n−1:0]:MID[m−1:0]:LSB[p−1:0]). When less precision is required, then the output of the third ADC stage may be omitted from the sample (e.g., replaced with zeros). When even less precision is required, then the outputs of the third ADC stage and the second ADC stage may be omitted from the sample (e.g., replaced with zeros). When an output for an ADC stage is omitted, then the ADC stage may be disabled, placed in a sleep mode, or otherwise not used to acquire data. When one or more ADC stages are disabled or otherwise not used to acquire data, an acquisition speed of a sample may be increased. Accordingly, the disclosed multi-stage ADC may be adapted for various applications with different requirements of resolution and speed by enabling or disabling ADC stages of the multi-stage ADC.

Figure 8:
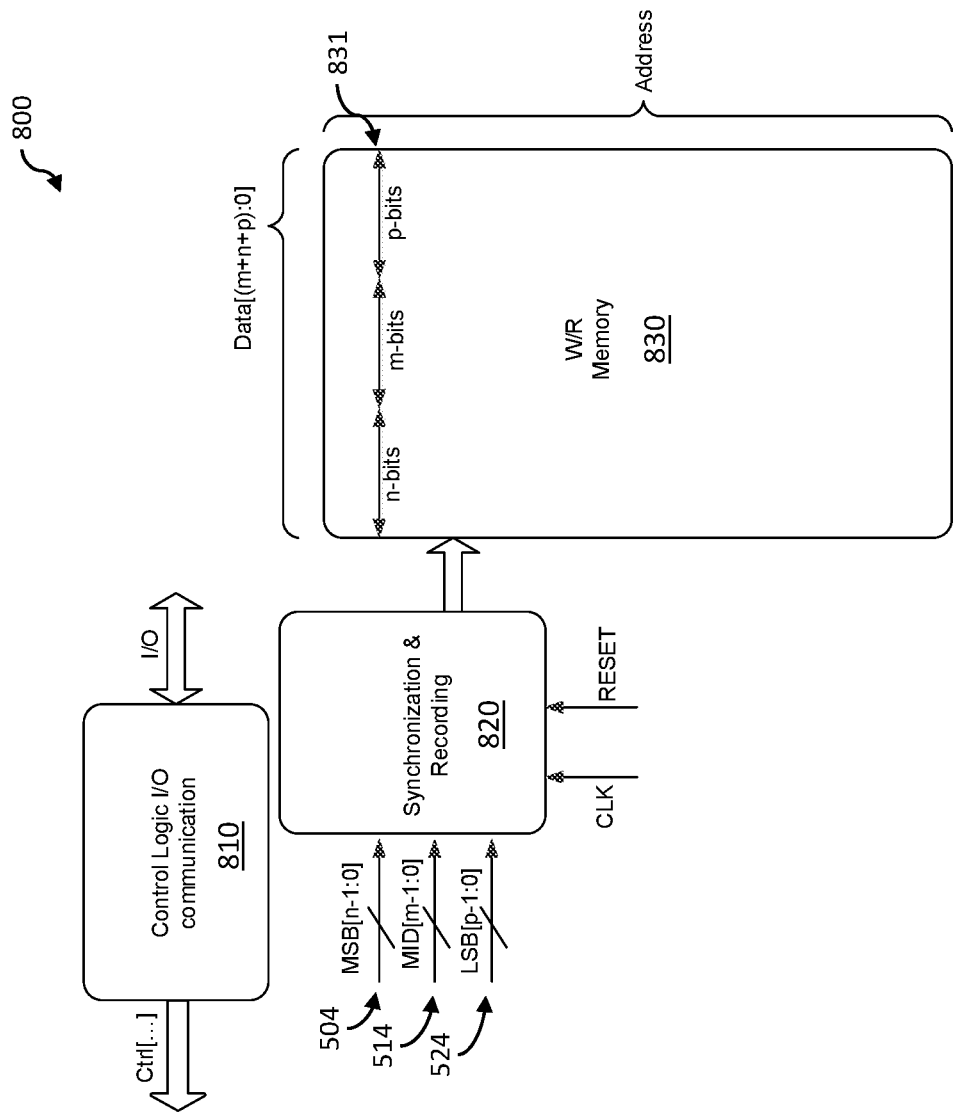
FIG. 8 schematically depicts a synchronous, digital portion of a multi-stage ADC according to an implementation of the present disclosure.

The outputs 504, 514, 524 of the ADC stages 501, 510, 520 are digital signals, and circuits that receive the outputs may be synchronous (i.e., require a clock). Accordingly, the multi-stage ADC may include a synchronous portion. FIG. 8 schematically depicts a possible synchronous portion of the multi-stage ADC. The synchronous portion 800 includes a synchronizing and recording circuit 820. The synchronizing and recording circuit receives the outputs 504, 514, 524 and is configured to record them in a write/read (W/R) memory 830 so that the bits are arranged in an order from most significant to least significant. For example, the outputs may be appended in a row 831 of the memory as shown. In other words, each ADC stage is configured to output a portion having a number of bits (i.e., a bit length). The resulting sample has an overall bit length corresponding to a sum of the bit length of each portion.

The synchronous portion of the multi-stage ADC also includes a control logic input-output (I/O) communication circuit 810 (i.e., I/O communication circuit). The I/O communication circuit 810 can be configured to communicate and control communications between the multi-stage ADC and other devices (e.g., a sensor). The I/O communication circuit (i.e., module) may also enable or disable each ADC stage and may further control the operation of each stage.

Figure 9:
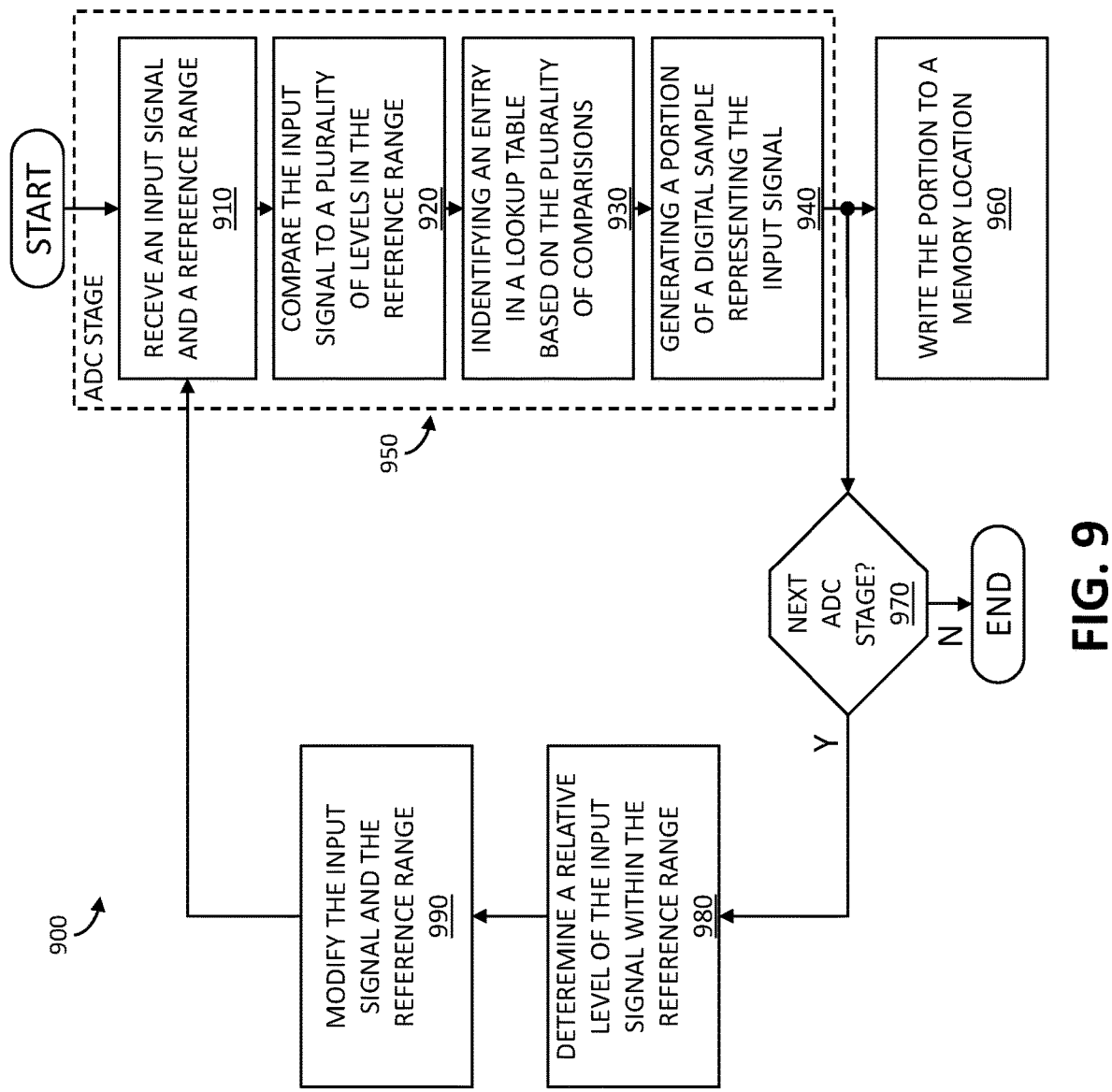
FIG. 9 is a flowchart of a method for digitizing an analog signal according to an implementation of the present disclosure.

FIG. 9 is a flowchart of a method for digitizing an analog signal according to an implementation of the present disclosure. The method 900 includes receiving 910 an input signal and a reference signal at an ADC stage 950 (i.e., a first ADC stage). The received input signal is then compared 920 to a plurality of levels in the reference range (e.g., using an analog front end computing circuit 130). Based on the plurality of comparisons, an entry in a lookup table (i.e., LUT 150, 250) is identified 930 and the entry is output. In other words, a bit portion (i.e., portion) of a digital sample representing the input signal is generated based on the entry (e.g., using an encoding circuit 140). If there is an ADC stage after the (first) ADC stage (i.e., there is a next ADC stage 970), then a relative level (i.e., level) of the input signal within the reference range is determined 980 and the input signal and the reference range is modified 990 for the next stage (i.e., by a quant. level computing circuit 160). In other words, a next input signal and a next reference range is created and used as inputs for a subsequent ADC stage. The modified input signal and reference signal are received 910 as the input signal and the reference signal and the process is repeated, as described above. The method further includes combining (i.e., appending) the bit portions before, or as a result of, writing 960 the bit portions (i.e., portion) of the digital sample to a memory location (i.e., according to the ADC stage that created the portion). For example, an asynchronous portion 800 of the multi-stage ADC may write the digital word output from each ADC stage to a location (i.e., row) in a memory in an order that corresponds to an order of the ADC stages in the multi-stage ADC.

In a possible implementation, the multi-stage ADC further includes a synchronous portion that can be configured to combine the digital signals from each of the ADC stages, record the combined digital signals in a memory, and communicate with one or more input devices (e.g., sensors). Accordingly, the multistage ADC may include an I/O and control module 810 that is configured to provide the control signals to the ADC stages and to communication with other devices. For example, the I/O and control module 810 may receive a current from a blood-glucose sensor and may provide to an ADC stage as an input current. The multistage ADC may also include a synchronization and recording portion 820 that can be configured to receive the digital outputs 504, 514, 524 from the ADC stage and to write those outputs to a address (e.g., a line) in a memory 830 (e.g., a read/write) memory. In the process of recording the bits of each digital output are arranged in order of significance. For example, the n-most significant bits may be followed by the m mid significant bits, which are in turn followed by the p least significant bits in a line (i.e., address) 831 of the memory 830.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

It will be understood that, in the foregoing description, when an element, such as a component is referred to as being connected to, electrically connected to, coupled to, or electrically coupled to another element, it may be directly on, connected or coupled to the other element, or one or more intervening elements may be present. In contrast, when an element is referred to as being directly connected to or directly coupled to another element or layer, there are no intervening elements present. Although the terms directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. A multi-stage analog-to-digital converter (ADC), the multi-stage ADC including:
   a plurality of ADC stages coupled in a sequence, each ADC stage including:
      an asynchronous circuit and a lookup table configured to output a portion of a digital sample representing a level of an input signal in a reference range; and
      a level computing circuit configured to generate a next input signal and a next reference range according to the level of the input signal in the reference range, and to transmit the next input signal and the next reference range to a subsequent ADC stage in the sequence; and
   a synchronizing and recording circuit configured to receive the portion of the digital sample from each of the plurality of ADC stages, combine the portions by sequentially writing the portions to a location in a memory.

2. The multi-stage ADC according to claim 1, wherein the portion of the digital sample from each stage has a bit length corresponding to a resolution for each ADC stage; and the digital sample has an overall bit length corresponding to a sum of the bit length of each portion.

3. The multi-stage ADC according to claim 1, wherein the portion of the digital sample from a first ADC stage in the sequence corresponds includes bits of the digital sample that are more significant than bits included in the portions of the digital sample from subsequent ADC stages in the sequence.

4. The multi-stage ADC according to claim 3, wherein at least one of the subsequent ADC stages in the sequence is disabled to obtain a faster digitization and lower resolution of the digital sample.

5. The multi-stage ADC according to claim 1, further comprising an input-output (I/O) communication circuit configured to enable/disable each of the plurality of ADC stages and configured to communicate with an input device coupled to the multi-stage ADC.

6. The multi-stage ADC according to claim 5, wherein the input device is a sensor configured to output a slow-moving signal.

7. The multi-stage ADC according to claim 5, wherein all or a portion of the ADC stages are periodically enabled to obtain a digital sample and otherwise disabled to reduce power consumption.

8. The multi-stage ADC according to claim 1, wherein each ADC stage has a resolution that is different from other ADC stages in the plurality of ADC stages.

9. The multi-stage ADC according to claim 1 wherein the plurality of ADC stages are current-mode ADC stages.

10. An analog-to-digital converter (ADC) stage for a multi-stage ADC, the ADC stage comprising:
    a front-end computing circuit configured to receive an input signal and a reference range, and to output signals at a plurality of front-end outputs, each front-end output corresponding to a comparison between the input signal and a level in the reference range;
    an encoding circuit that receives the plurality of outputs and, based on the plurality of outputs, retrieves a digital word from a lookup table and outputs the digital word at an ADC-stage output; and
    a quantum-level computing circuit coupled to the input signal and to the plurality of front-end outputs, the quantum-level computing circuit configured to determine a relative level of the input signal within the reference range and to modify, based on the relative level, the reference range and the input signal for a subsequent ADC stage in the multi-stage ADC.

11. The ADC stage according to claim 10, wherein the front-end computing circuit is an asynchronous, analog circuit.

12. The ADC stage according to claim 10, wherein the ADC stage is a voltage-mode ADC and the input signal is a voltage.

13. The ADC stage according to claim 10, wherein the ADC stage is a current-mode ADC and the input signal is a current.

14. The ADC stage according to claim 10, wherein each signal at each of the plurality of front-end outputs is a voltage corresponding to a high level or a low level, the voltage generated by a comparator.

15. The ADC stage according to claim 14, wherein the encoding circuit includes a decision block that includes a plurality of decision-block inputs that are coupled to the plurality of front-end outputs and that further includes a plurality of decision-block outputs that are coupled to a plurality of lookup-table inputs, the decision-block configured to:
    output a high-level voltage at one of the decision-block outputs based on a combination of high level and low level voltages at the decision-block inputs.

16. The ADC stage according to claim 15, wherein the lookup table is configured to store a plurality of digital words, each digital word corresponding to one of the plurality of lookup-table inputs, so that a high-level voltage at one of the lookup table inputs configures the lookup table to retrieve the digital word from the lookup table and output the digital word at the ADC-stage output.

17. The ADC stage according to claim 10, wherein the lookup table includes a memory and the ADC-stage output is a digital signal generated to correspond to an entry in the memory.

18. The ADC stage according to claim 17, wherein generating the ADC-stage output does not include combinatorial or sequential logic.

19. A method for digitizing an analog signal, comprising:
receiving an input signal and a reference range at an ADC stage in a sequence of ADC stages;
comparing the input signal to a plurality of levels in the reference range;
identifying an entry in a lookup table based on the comparison of the input signal to the plurality of levels;
generating a portion of a digital sample representing the input signal based on the entry;
determining a level of the input signal within the reference range;
modifying the input signal and the reference range; and
repeating the receiving, comparing, identifying, generating, determining, and modifying at a subsequent ADC stage in the sequence of ADC stages.

20. The method for digitizing an analog signal according to claim 19, further comprising:
appending the portions generated at each ADC stage in the sequence of ADC stages to form the sample of the input signal.

* * * * *